United States Patent
Jao et al.

(10) Patent No.: US 7,880,297 B2
(45) Date of Patent: Feb. 1, 2011

(54) SEMICONDUCTOR CHIP HAVING CONDUCTIVE MEMBER FOR REDUCING LOCALIZED VOLTAGE DROP

(75) Inventors: Che-Yuan Jao, Hsinchu (TW); Sheng-Ming Chang, Taipei County (TW); Ching-Chih Li, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 16 days.

(21) Appl. No.: 12/116,969

(22) Filed: May 8, 2008

(65) Prior Publication Data

US 2009/0166849 A1 Jul. 2, 2009

Related U.S. Application Data

(60) Provisional application No. 61/017,808, filed on Dec. 31, 2007.

(51) Int. Cl.
| | |
|---|---|
| *H01L 23/12* | (2006.01) |
| *H01L 23/06* | (2006.01) |
| *H01L 23/10* | (2006.01) |
| *H01L 23/40* | (2006.01) |
| *H01L 23/48* | (2006.01) |
| *H01L 23/52* | (2006.01) |

(52) U.S. Cl. .................. 257/700; 257/684; 257/686; 257/734; 257/758; 257/759

(58) Field of Classification Search ................ 257/700, 257/686, 692, 693, 706, 712, 713, E23.01, 257/E23.011; 438/597, 624
See application file for complete search history.

(56) References Cited

U.S. PATENT DOCUMENTS

| 6,770,982 | B1 | 8/2004 | Liou | |
|---|---|---|---|---|
| 6,913,946 | B2 * | 7/2005 | Lin | 438/106 |
| 2002/0186545 | A1 * | 12/2002 | Fukada et al. | 361/719 |
| 2003/0017650 | A1 * | 1/2003 | Armbrust et al. | 438/122 |
| 2003/0042583 | A1 * | 3/2003 | Chen et al. | 257/666 |
| 2005/0269684 | A1 * | 12/2005 | Baek et al. | 257/691 |
| 2006/0125088 | A1 * | 6/2006 | Huang et al. | 257/707 |
| 2006/0163734 | A1 * | 7/2006 | Thei et al. | 257/758 |
| 2007/0064398 | A1 * | 3/2007 | Lee et al. | 361/704 |
| 2008/0038874 | A1 * | 2/2008 | Lin | 438/118 |
| 2008/0054457 | A1 * | 3/2008 | Lin et al. | 257/737 |

* cited by examiner

*Primary Examiner*—N Drew Richards
*Assistant Examiner*—Michael Jung
(74) *Attorney, Agent, or Firm*—Winston Hsu; Scott Margo

(57) ABSTRACT

A semiconductor chip includes a die mounted on a packaging substrate. The die includes a semiconductor substrate; inter-metal dielectric layers on the semiconductor substrate; levels of metal interconnection, wherein at least two potential equivalent metal traces are formed in a level of the metal interconnection; a passivation layer disposed over the two metal traces, wherein two openings are formed in the passivation layer to expose portions of the two metal traces; a conductive member externally mounted on the passivation layer between the two openings; and a redistribution layer formed over the conductive member.

17 Claims, 13 Drawing Sheets

SEMICONDUCTOR CHIP HAVING CONDUCTIVE MEMBER FOR REDUCING LOCALIZED VOLTAGE DROP

CROSS REFERENCE TO RELATED APPLICATIONS

This application claims the benefit of U.S. provisional application No. 61/017,808 filed Dec. 31, 2007.

BACKGROUND OF THE INVENTION

1. Field of the Invention

This invention relates generally to the field of semiconductor chip and chip packaging. More particularly, this invention relates to an improved package structure for integrated semiconductor circuit devices.

2. Description of the Prior Art

One design consideration related to the decreasing size of IC components is voltage (or "IR") drop across the IC. Generally, an external power supply source is connected to the internal die circuitry via lead pins and bond pads that connect directly to the die, via power pad cells. A power-bus grid of thin metal wires is typically used to route the power from the power pad cells to the die circuitry throughout the core.

Power distributed to the die circuitry via the power-bus grid can present significant problems. For example, where circuits are intended to operate at relatively low-level voltages, a slight voltage drop can result in defective operation. Such a voltage drop across a wire, or region of the die, is proportional to the amount of current the wire or region is conducting as well as the corresponding internal resistance.

The internal resistance in the power distribution structures of ICs is therefore a subject of much scrutiny and significant research to ensure that no more than the sufficient amount of power routing is provided or designers must guess as to the appropriate amount of power routing. To avoid these failures, IC designers attempt to manage voltage drops throughout the design process.

U.S. Pat. No. 6,770,982 to Liou discloses an integrated circuit power distribution system to reduce the voltage drop. The integrated circuit includes a semiconductor die that includes at least one pair of bond pads having a single bond wire connected thereto such that each bond pad of the pair of bond pads has only one bond wire end connected thereto. A first bond pad of the pair of bond pads is located in an internal portion of the semiconductor die. A first wire having a first end and a second end is electrically connected between the pair of bond pads.

SUMMARY OF THE INVENTION

It is one object of this invention to provide an improved semiconductor chip that is capable of reducing localized voltage drops thereby improving device performance.

According to one embodiment, a semiconductor chip comprises an integrated circuit die that is mounted on a first side of a packaging substrate. The integrated circuit die comprises a semiconductor substrate; a plurality of inter-metal dielectric (IMD) layers on the semiconductor substrate; a plurality of levels of metal interconnection in the respective IMD layers, wherein at least two potential equivalent metal traces are formed in one level of the metal interconnection; a passivation layer covering the at least two potential equivalent metal traces, wherein two openings are formed in the passivation layer to expose portions of the at least two potential equivalent metal traces; a conductive member externally mounted on the passivation layer between the two openings; and a redistribution layer (RDL) formed over the conductive member, wherein the RDL fills into the openings such that the potential equivalent metal traces are electrically connected to each other through the RDL and the conductive member.

In one aspect, a method for fabricating a semiconductor chip is provided. The method includes providing an integrated circuit die including a semiconductor substrate having thereon a core circuit region and a peripheral input/output (I/O) region, at least two potential equivalent metal traces in a level of metal interconnection within the core circuit region; and a passivation layer disposed over the at least two potential equivalent metal traces; forming two openings in the passivation layer for exposing portions of the at least two potential equivalent metal traces; externally mounting a conductive member on the passivation layer between the two openings; and forming a redistribution layer (RDL) over the conductive member to electrically connect the at least two potential equivalent metal traces with the conductive member.

According to another embodiment, a semiconductor chip includes an integrated circuit die mounted on a first side of a packaging substrate. The integrated circuit die includes at least two potential equivalent metal traces formed in a level of metal interconnection; a passivation layer covering the at least two potential equivalent metal traces, wherein two openings are formed in the passivation layer to expose portions of the at least two potential equivalent metal traces; a redistribution layer (RDL) formed on the passivation layer, wherein the RDL fills into the openings and defines a cavity over the passivation layer; and a conductive member inlaid into the cavity.

In another aspect, a method for fabricating a semiconductor chip is provided. The method includes providing an integrated circuit die including a semiconductor substrate having thereon a core circuit region and a peripheral input/output (I/O) region, at least two potential equivalent metal traces in a level of metal interconnection within the core circuit region; and a passivation layer disposed over the at least two potential equivalent metal traces; forming two openings in the passivation layer for exposing portions of the at least two potential equivalent metal traces; forming a redistribution layer (RDL) over the passivation layer to form a cavity over the passivation layer between the two openings; and externally mounting a conductive member in the cavity between the two openings.

These and other objectives of the present invention will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The embodiments pertain to an improved semiconductor chip and chip packaging capable of reducing localized voltage drops and improving thermal performance thereof. In one embodiment, an exemplary PBGA (plastic ball grid array) package with a metal heat spreader is provided. The PBGA package is a surface mount package that can provide higher thermal and electrical performance, and a lower thickness profile and a smaller footprint, as compared to leadframe based surface mount packages such as Plastic Quad Flat Package (PQFP).

The embodiment particularly addresses the concerns of electrical performance of the PBGA package that in addition provides advantages of thermal performance and advantages of assembly such as low cost and being flexible solution that does not require a redesign of the substrate over which the die is mounted. The semiconductor chip and chip packaging of the embodiment are compatible with conventional manufacturing standards or processes such as wafer-level chip-scale packaging (WLCSP). The embodiment can also be applicable to System-in-Package (SiP), where multiple dies are put in one package.

Typically, to provide a bondable interface atop a copper bond pad that is formed in the topmost copper metal layer of an integrated circuit chip or die, a layer of aluminum is disposed over the passivation layer. Also, the aluminum layer can avoids oxidation of the underlying copper bond pad. In some cases, the layer of aluminum disposed over the passivation layer is used to form so-called redistribution layer (RDL), which is primarily used for flip-chip applications. In current copper processes, the aluminum pad is still required for wire-bonding or bump processes. RDL with flip chip technology is gaining popularity for stacking dies in a single package because most of the in-demand consumer electronics products have limited PCB real estate.

One embodiment of the present invention will now be explained with reference to the accompanying figures. Throughout the specification and drawings, the symbol "$M_n$" refers to the topmost level of the copper metal layers fabricated in the integrated circuit chip or die, while "$M_{n-1}$" refers to the copper metal layer that is just one level lower than the topmost copper metal layer and so on, wherein, possibly, n ranges between 5 and 8 (n=5-8), but not limited thereto. The symbol "V" refers to via plug that directly connects two adjacent copper metal layers M. For example, $V_5$ refers to the via plug interconnecting $M_5$ to $M_6$.

Figure 1:
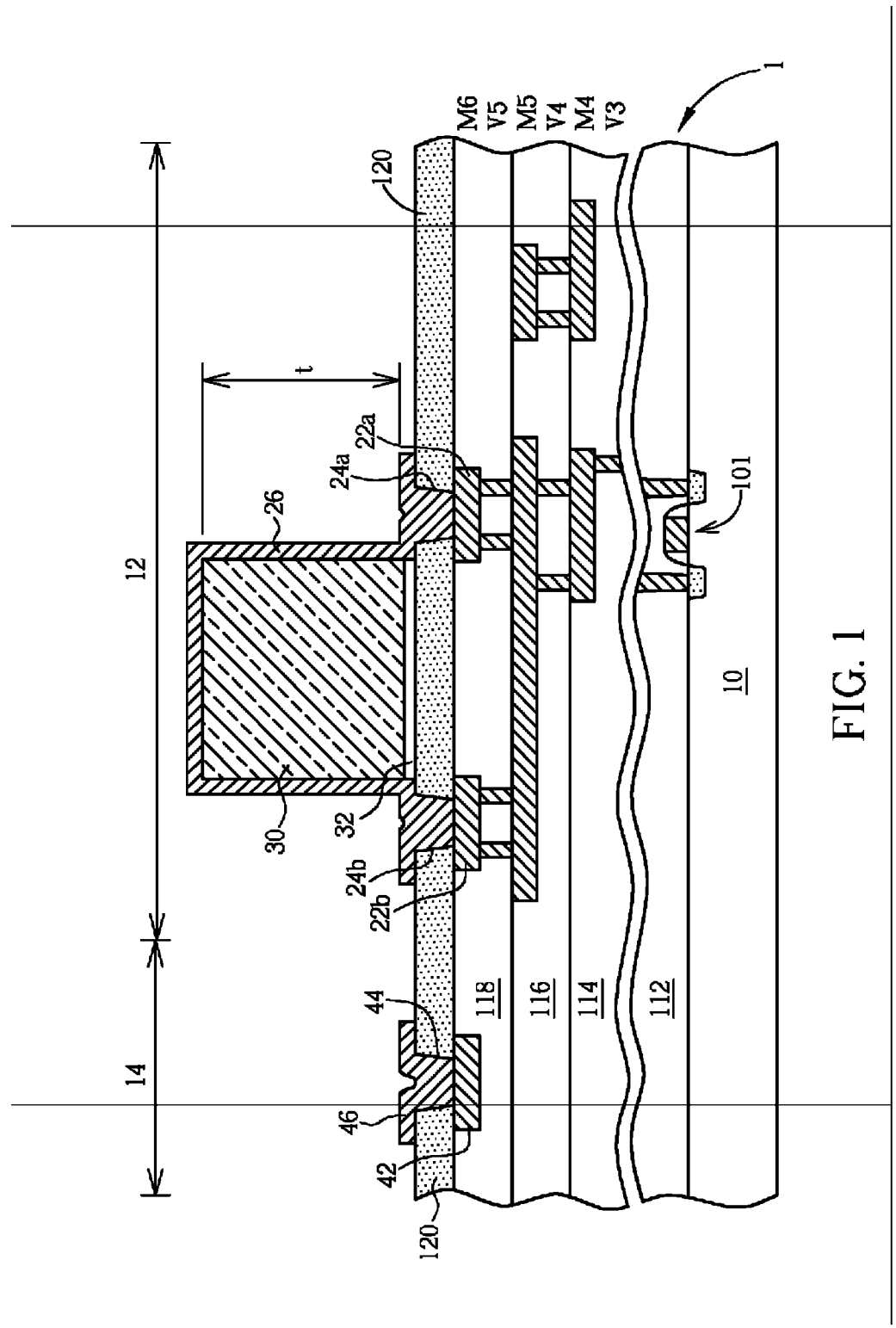
FIG. 1 is a schematic, cross-sectional diagram showing a portion of an exemplary integrated circuit die in accordance with the first embodiment of this invention.

FIG. 1 is a schematic, cross-sectional diagram showing a portion of an exemplary integrated circuit die 1 in accordance with the first embodiment of this invention. It is noted that the interconnection scheme of the integrated circuit die 1 as depicted in FIG. 1 is exemplary and is based on a so-called 1P6M (one polysilicon layer and six copper metal layers) scheme. However, this invention may be applicable to other interconnection schemes such as 1P5M, 1P7M, 1P8M, etc.

The integrated circuit die 1 includes a semiconductor substrate 10 having an internal region (e.g., core circuit region 12) and a peripheral input/output (I/O) region 14. The semiconductor substrate 10 may be a silicon substrate, a silicon-on-insulator (SOI) substrate, SiGe substrate or the like. Within the core circuit region 12, at least one core circuit device 101 such as a transistor, a capacitor or a memory cell (not shown) is formed on or in the semiconductor substrate 10.

By way of example, inter-metal dielectric (IMD) layers 112, 114, 116 and 118 are deposited over the semiconductor substrate 10. The IMD layers 112, 114, 116 and 118 may be formed of low dielectric constant (low-k) materials or ultra low-k materials, but not limited thereto. One or more layers of the IMD layers 112, 114, 116 and 118 may comprise conventional dielectric layer such as silicon oxide, silicon nitride, silicon carbide or silicon oxy-nitride. The low-k or ultra low-k materials described herein may be either organic (e.g., SiLK) or inorganic (e.g., HSQ) and may be of a porous or non-porous nature.

According to the first embodiment, the exemplary six levels of metal interconnection, e.g., six levels of copper metal layers, are fabricated in the IMD layers 112, 114, 116 and 118 respectively, wherein, for the sake of simplicity, merely the overlying $M_4$-$M_6$ and $V_3$-$V_5$ are demonstrated in FIG. 1. The metal interconnection and respective via plugs may be fabricated using copper damascene processes or dual damascene processes, which are well known in the art and are therefore not discussed further.

In one of the copper metal layers, such as the topmost copper metal layer $M_6$, at least two potential equivalent copper traces 22a and 22b, for routing the substantially same voltage signals are provided within the core circuit region 12. For example, both of the two exemplary potential equivalent copper traces 22a and 22b are coupled to an equivalent voltage potential such as a signal of ground voltage $V_{SS}$, or both of them are coupled to a signal of power supply voltage $V_{DD}$. Power or ground signal ($V_{DD}$ or $V_{SS}$) may be provided from the two exemplary potential equivalent copper traces 22a and 22b to the underlying core circuit device 101 by way of the intervening copper interconnection structure (not explicitly shown) in the core circuit region 12.

Within the peripheral input/output (I/O) region 14, a copper bond pad 42 is formed in the topmost copper metal layer $M_6$. For the sake of simplicity, the I/O buffer circuits or ESD devices, which are not germane to this invention, are not shown in this figure. A passivation layer 120 is deposited on the IMD layer 118. The passivation layer 120 covers the potential equivalent copper traces 22a, 22b as well as the copper bond pad 42.

According to the first embodiment, the passivation layer 120 may be silicon oxide, silicon nitride, polyimide or other suitable materials. In the passivation layer 120, openings 24a, 24b and opening 44 corresponding to the potential equivalent copper traces 22a, 22b and the copper bond pad 42 are provided. The openings 24a, 24b expose portions of the potential equivalent copper traces 22a, 22b that receive the same voltage signal. The opening 44 exposes a portion of a top surface of the copper bond pad 42. The openings 24a, 24b may be, for example, elongate slots extending along the length of the respective copper traces 22a, 22b, but not limited to this embodiment. An aluminum bond pad 46 is formed inside the opening 44 for wire bonding purposes.

A thick (>5 μm) conductive member 30 such as a piece of metal or a dummy die is externally mounted on the passivation layer 120 between the opening 24a and opening 24b. For example, the conductive member 30 is a piece of copper, gold, silver or alloys thereof. The conductive member 30 may not overlap with the opening 24a or opening 24b. According to the first embodiment, the conductive member 30 has a thickness t greater than 5 μm, exemplarily ranging between 1-7 mil (25-175 μm), more preferably between about 3-5 mil (75-125 μm). It is noted that the thickness t of the conductive member 30 can vary and depends upon form factor or heat dissipation requirements.

A spacer layer 32 may be interposed between the conductive member 30 and the passivation layer 120. The spacer layer 32 may be made of insulative materials or adhesive materials. A capping layer, such as a redistribution layer (RDL) 26, conformally covers the sidewalls and the top surface of the conductive member 30. The RDL 26 also fills into the opening 24a and the opening 24b such that the potential equivalent copper traces 22a and 22b can be electrically connected to each other through the RDL 26 and the conductive member 30. Since the conductive member 30 is thick, the resistance is thus relatively small, thereby reducing the localized voltage drop. It is to be understood that although FIG. 1 shows that the sidewalls and the top surface of the conductive member 30 are completely covered with the RDL 26, this is merely an exemplary case and should not be limiting. In some cases, some portions of the conductive member 30 may not be fully covered by the RDL 26 due to the difficulty in the deposition process.

From the fabrication perspective, the aluminum bond pad 46, the RDL 26 and the conductive member 30 may be fabricated in a package assembly factory, but not limited thereto. FIGS. 2-6 are schematic, cross-sectional diagrams showing the exemplary method for fabricating the integrated circuit die 1 of FIG. 1, wherein like numeral numbers designate like elements, layers or regions.

Figure 2:
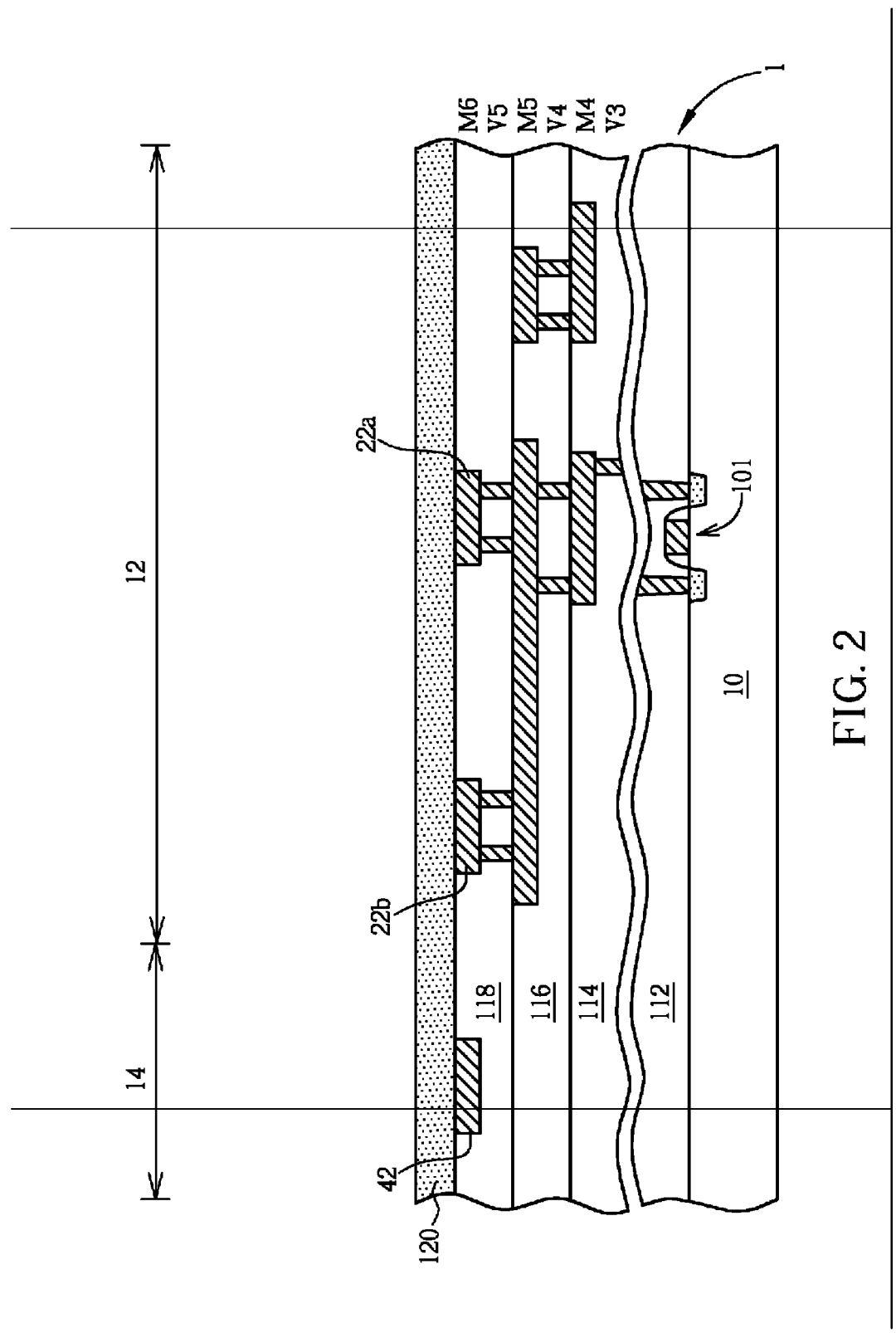
FIGS. 2-6 are schematic, cross-sectional diagrams showing the exemplary method for fabricating the integrated circuit die of FIG. 1.

As shown in FIG. 2, after the formation of the metal interconnection structure from $M_1$ to $M_6$, a passivation layer 120 is deposited over the semiconductor substrate 10. The aforesaid metal interconnection structure includes potential equivalent copper traces 22a, 22b for routing either power or ground signals within the core circuit region 12 and copper bond pad 42 within the peripheral I/O region 14. The passivation layer 120 covers the potential equivalent copper traces 22a, 22b and the copper bond pad 42. According to the first embodiment, the passivation layer 120 may be silicon oxide, silicon nitride or polyimide.

Figure 3:
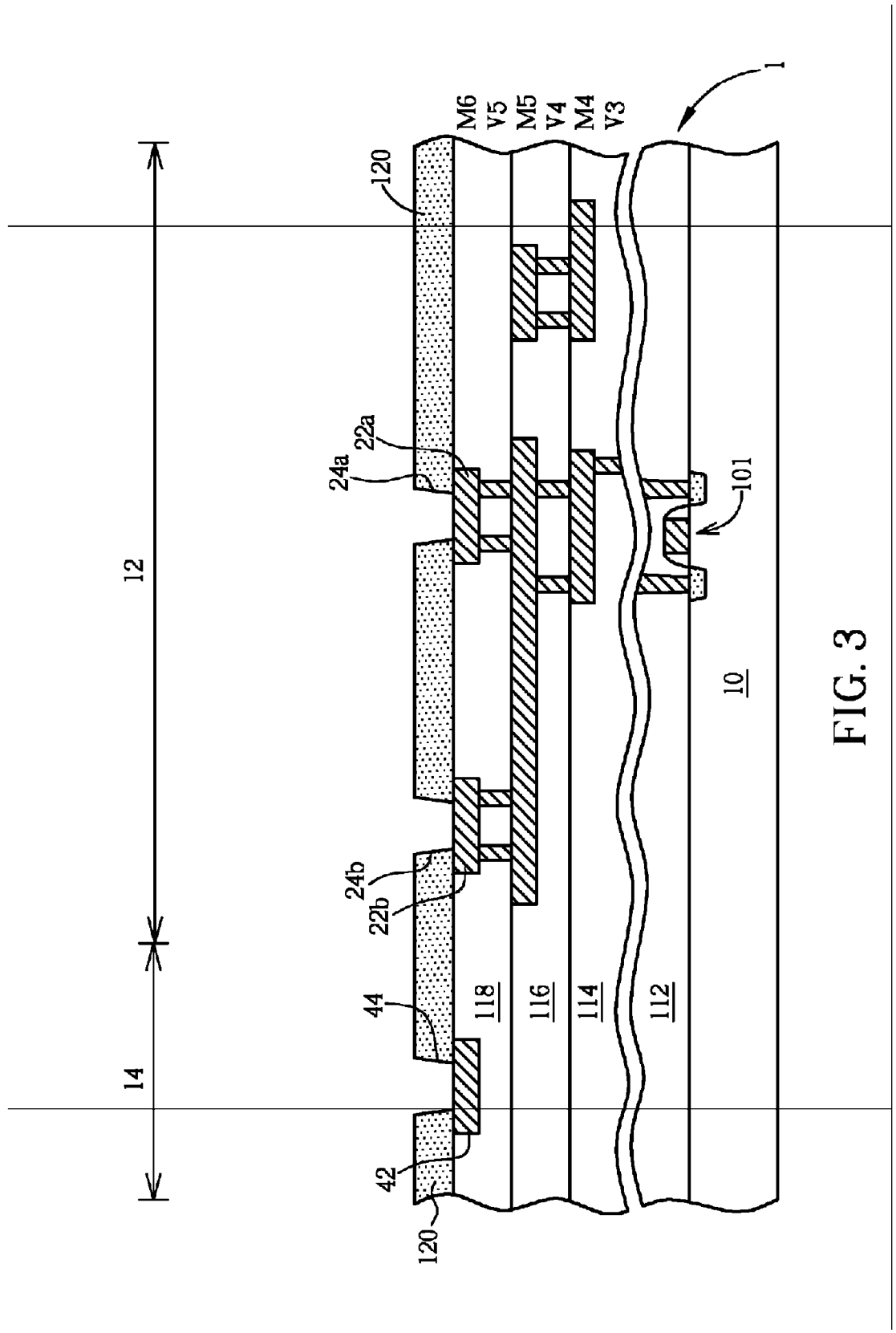

Subsequently, as shown in FIG. 3, a conventional lithographic and etching process is carried out to form openings 24a, 24b and opening 44 in the passivation layer 120. The openings 24a, 24b and opening 44 are disposed directly above the copper traces 22a, 22b and the copper bond pad 42, respectively. The opening 24a exposes a portion of the copper trace 22a. The opening 24b exposes a portion of the copper trace 24b. The opening 44 exposes a portion of the copper bond pad 42. As previously mentioned, the openings 24a, 24b may be, for example, elongate slots extending along the length of respective copper traces 22a, 22b. Thereafter, the integrated circuit die 1 may be subjected to a so-called chip-probing (CP) test for checking whether the internal circuitry thereof would operate normally.

Figure 4:
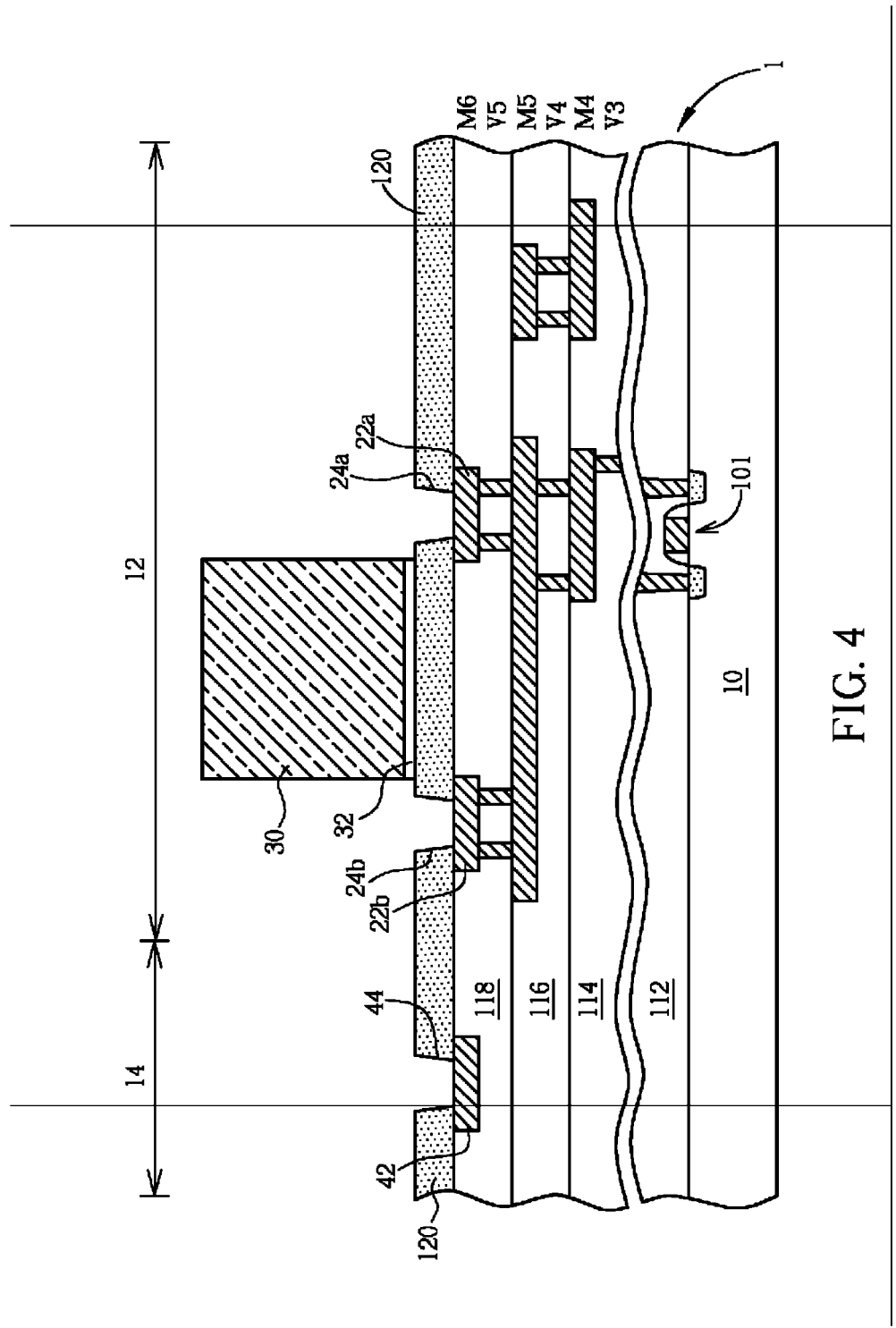

As shown in FIG. 4, a conductive member 30 such as a piece of copper is then externally mounted on the passivation layer 120 between the opening 24a and the opening 24b. The conductive member 30 has a thickness exemplarily ranging between 3 mil and 5 mil. The thickness of the conductive member 30 can vary and depends upon form factor or heat dissipation requirements. The conductive member 30 may be affixed on the passivation layer 120 using conventional surface mount technology. In such case, the spacer layer 32 disposed between the conductive member 30 and the passivation layer 120 is composed of adhesive materials.

Figure 5:
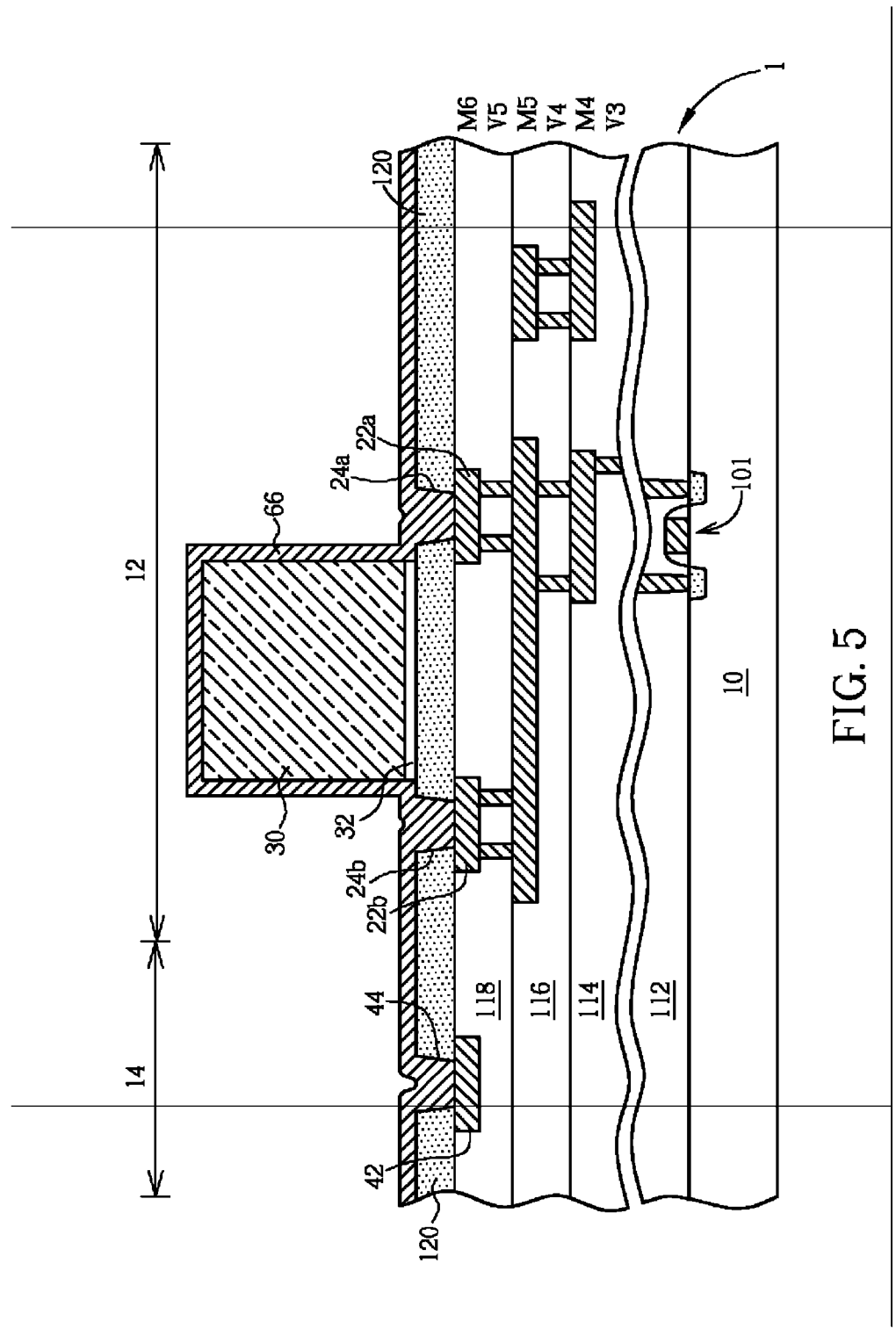

As shown in FIG. 5, a blanket metal layer 66 such as aluminum is then deposited on the integrated circuit die 1 over the passivation layer 120. The metal layer 66 is also known as a so-called RDL. The metal layer 66 conformally covers the sidewalls and the top surface of the conductive member 30 and fills into the opening 24a, 24b and 44. The metal layer 66 may be deposited by physical vapor deposition (PVD) or other sputtering methods. The metal layer 66 may be aluminum, copper or alloys thereof.

Figure 6:
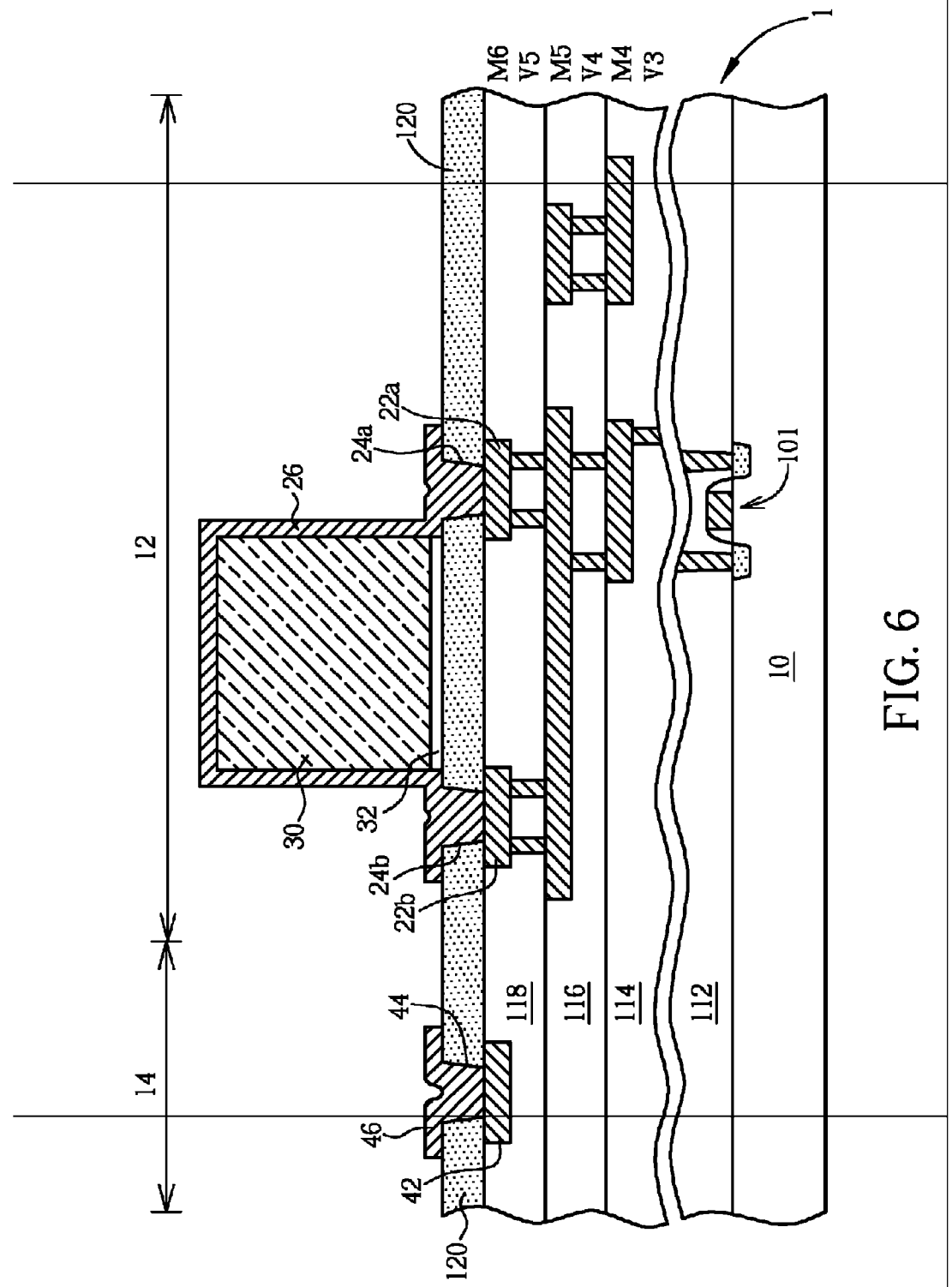

As shown in FIG. 6, the blanket metal layer 66 is patterned by using conventional lithographic and etching processes to form the aluminum bond pad 46 that is directly on the copper bond pad 42 and the RDL 26 that electrically connects the potential equivalent copper traces 22a, 22b with the conductive member 30. Subsequently, typical packaging process may be carried out to complete the semiconductor device package, for example, the integrated circuit die 1 is then mounted onto a packaging substrate; and thereafter a heat spreader (not shown) is positioned and mounted on the packaging substrate.

Figure 7:
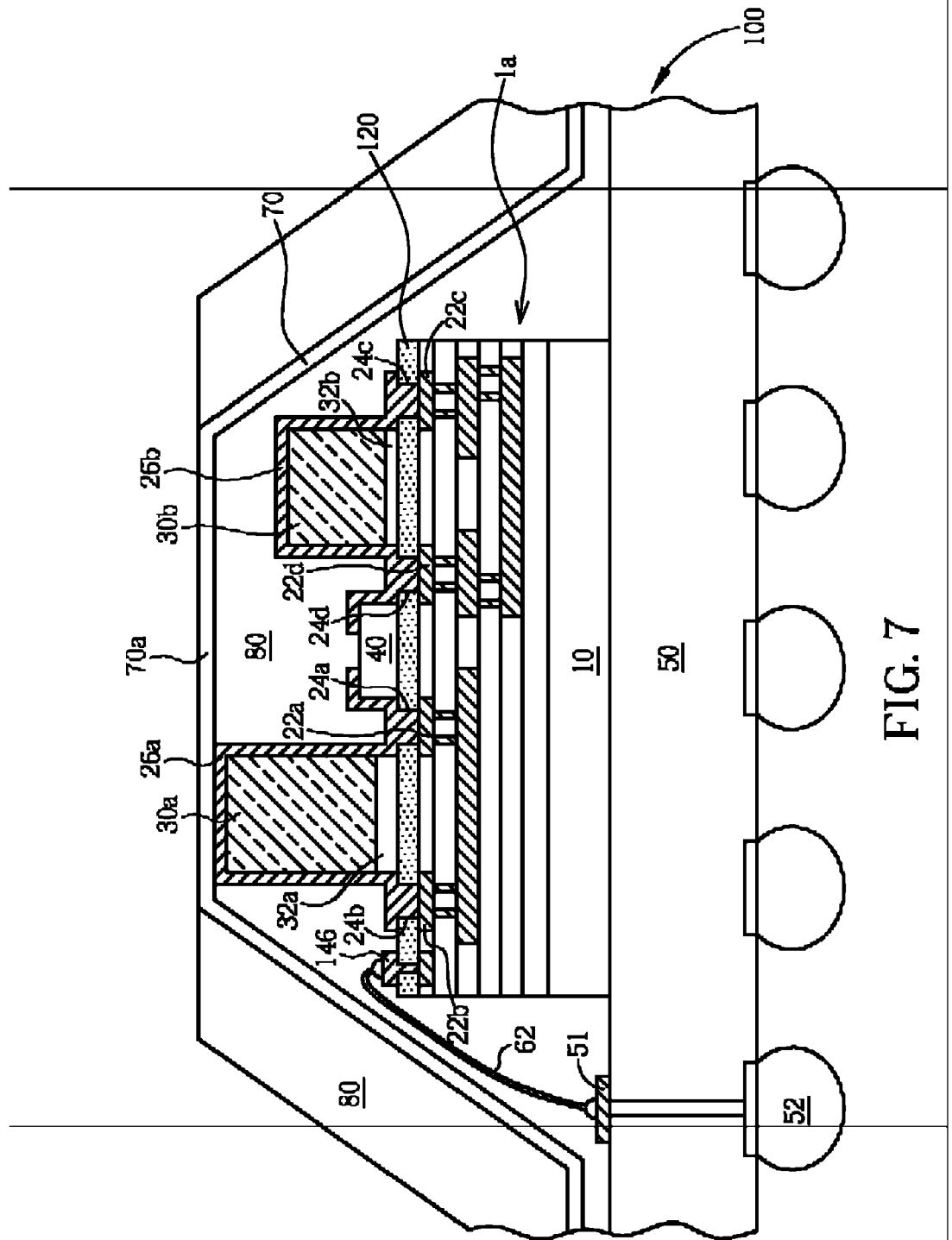
FIG. 7 is a schematic, cross-sectional diagram showing an exemplary PBGA package having a metal heat spreader according to another embodiment of this invention.

FIG. 7 is a schematic, cross-sectional diagram showing an exemplary PBGA package 100 of an integrated circuit die 1a according to another embodiment of this invention. As shown in FIG. 7, an integrated circuit die 1a is surface mounted on a first side of a packaging substrate 50, such as a printed circuit board, ceramic substrates or plastic substrates. The packaging substrate 50 has thereon at least one wire bond pad 51 such as a ground pad on its first side and is wire bonded to a corresponding peripheral I/O bond pad 146 on the integrated circuit die 1a via wire bond 62 such as a gold wire. On the second side (opposite to the first side) of the packaging substrate 50, a plurality of solder balls 52 are provided. The PBGA package 100 can be attached to a product board by reflowing the solder balls 52 to establish electrical and structural connection.

Likewise, the integrated circuit die 1a includes a semiconductor substrate 10 such as a silicon substrate, a silicon-on-insulator (SOI) substrate, SiGe substrate or the like. A bottom side of the semiconductor substrate 10 is surface mounted on the first side of the packaging substrate 50. A plurality of inter-metal dielectric (IMD) layers are formed on the semiconductor substrate 10. The IMD layers may be formed of low dielectric constant (low-k) materials or ultra low-k materials, but not limited thereto. The IMD layers may comprise conventional dielectric layer such as silicon oxide, silicon nitride, silicon carbide or silicon oxy-nitride. The low-k or ultra low-k materials described herein may be either organic (e.g., SiLK) or inorganic (e.g., HSQ) and may be of a porous or non-porous nature. A plurality of levels of metal interconnection are formed in the respective IMD layers. For the sake of simplicity, merely an upper portion of the metal interconnection structure is demonstrated. The metal interconnection and respective via plugs may be fabricated using copper damascene processes or dual damascene processes, which are well known in the art and are therefore not discussed further.

In a copper metal layer of the metal interconnection structure, copper traces 22a, 22b for routing ground signal $V_{SS}$ and copper traces 22c, 22d for routing power signal $V_{DD}$ are provided. That is, the copper traces 22a and 22b are of an equivalent potential of ground signal $V_{SS}$, and the copper traces 22a and 22b are of another equivalent potential of power signal $V_{DD}$. A passivation layer 120 covers the copper traces 22a, 22b and 22c, 22d. The passivation layer 120 may be silicon oxide, silicon nitride, polyimide or other suitable materials. In the passivation layer 120, openings 24a, 24b and openings 24c, 24d corresponding to the copper traces 22a, 22b and the copper traces 22c, 22d are provided. The openings 24a, 24b and openings 24c, 24d expose portions of the copper traces 22a, 22b and the copper traces 22c, 22d, respectively. The openings 24a, 24b and 24c, 24d may be, for example, elongate slots extending along the respective copper traces 22a, 22b and 22c, 22d.

A thick (>1 mil) conductive member 30a and a conductive member 30b such as a piece of metal or a dummy die are externally mounted on the passivation layer 120 between the opening 24a and opening 24b and between the opening 24c and opening 24d, respectively. A spacer layer 32a and a spacer layer 32b may be interposed between the conductive member 30a and the passivation layer 120 and between the conductive member 30b and the passivation layer 120. The spacer layers 32a and 32b may be made of insulative materials or adhesive materials. According to this embodiment, the conductive members 30a and 30b is copper, gold, silver or alloys thereof.

More particularly, the conductive member 30a has a thickness greater than 5 µm, for example, ranging between 3-5 mil (75-125 µm). In the example, the conductive member 30b is thinner than the conductive member 30a. The thickness of the conductive member 30b preferably ranges between 2-5 mil. It is noted that the thickness of the conductive member 30a or 30b can vary and depends upon form factor or heat dissipation requirements.

An RDL 26a conformally covers the sidewalls and the top surface of the conductive member 30a. An RDL 26b conformally covers the sidewalls and the top surface of the conductive member 30b. The RDL 26a and 26b also respectively fills into the openings 24a, 24b and the openings 24c, 24d such that the potential equivalent copper traces 22a and 22b can be electrically connected to each other through the RDL 26a and the conductive member 30a, and the potential equivalent copper traces 22c and 22d can be electrically connected to each other through the RDL 26b and the conductive member 30b. Since the conductive members 30a and 30b are thick, the resistance of them is relatively small, thereby reducing the voltage drop.

According to the embodiment of this invention, a passive component 40 such as a decoupling capacitor is provided on the passivation layer 120 between the opening 24a and the opening 24d. One terminal of the passive component 40 may be electrically connected to the RDL 26a to receive ground signal $V_{SS}$, while another terminal of the passive component 40 may be electrically connected to the RDL 26b to receive power signal $V_{DD}$.

According to the embodiment of this invention, the PBGA package 100 further comprises a heat spreader 70 that is mounted on the first side of the packaging substrate 50. The heat spreader 70, which is generally in a shape of a truncated square pyramid with chamfered slant edges, caps the integrated circuit die 1a for dissipating heat generated from the integrated circuit die 1a. A mold cap 80 encapsulates the integrated circuit die 1a and the heat spreader 70. The heat spreader 70 may be either completely or partially embedded in the mold cap 80. In a case that the heat spreader 70 is partially embedded in the mold cap 80, a top surface of a plain portion 70a of the heat spreader 70 is exposed to the ambient and is free of molding compound.

One germane feature of this invention is that the plain portion 70a of the heat spreader 70 is in direct contact with the RDL 26a that covers the conductive member 30a. The conductive members 30a and 30b (especially the conductive member 30a) and the RDL 26a and 26b covers thereon respectively can significantly reduce the thermal resistance between the plain portion 70a of the heat spreader 70 and the integrated circuit die 1a, allowing greater heat flow to the top surface of the heat spreader 70 and then dissipate to the ambient.

Besides, since the heat spreader 70 is coupled to ground signal $V_{SS}$, self or mutual inductances may be reduced and the grounded heat spreader 70 can increase the signal transmission efficiency due to low losses. Furthermore, the grounded heat spreader 70 can effectively mitigate the electromagnetic interference (EMI) problems that may occur in a floating heat spreader case at high frequencies.

Figure 8:
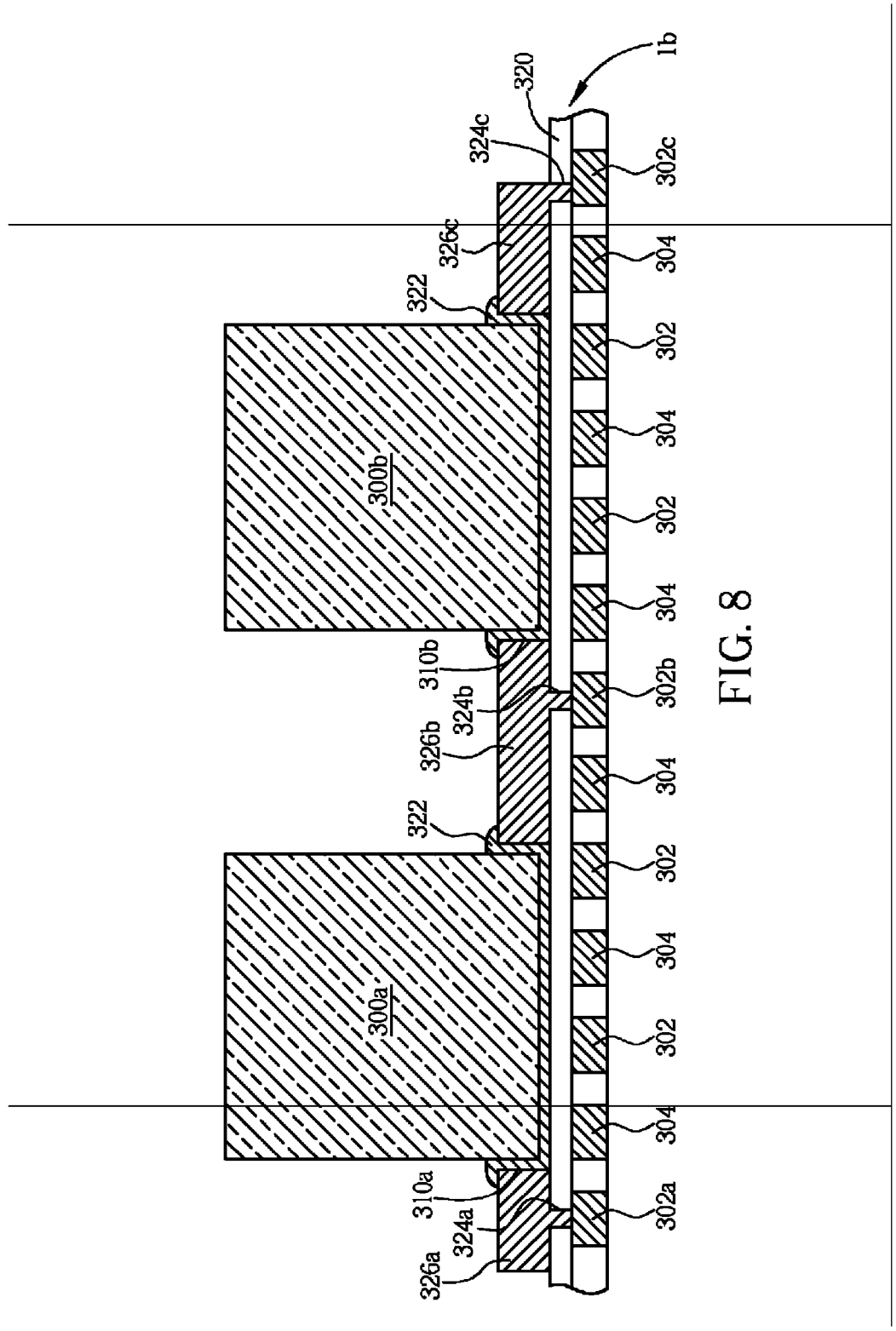
FIG. 8 is a schematic, cross-sectional diagram showing the germane portion of an integrated circuit die in accordance with the second embodiment of this invention.

In another aspect, the conductive member may be mounted on the passivation layer after the RDL process is completed. FIG. 8 is a schematic, cross-sectional diagram showing the germane portion of an integrated circuit die 1b in accordance with the second embodiment of this invention, wherein the conductive member is mounted on the passivation layer after the RDL process is completed. For the sake of simplicity, merely the topmost copper metal layer is demonstrated.

As shown in FIG. 8, a plurality of copper metal traces 302 and 304 for routing ground or power signals are formed in the copper metal layer of the integrated circuit die 1b. A passivation layer 320 is deposited to cover the plurality of copper metal traces 302 and 304. The passivation layer 120 may be silicon oxide, silicon nitride, polyimide or other suitable materials. In the passivation layer 120, openings 324a, 324b and 324c corresponding to the copper traces 302a, 302b and 302c are provided. The openings 324a, 324b and 324c expose portions of the copper traces 302a, 302b and 302c, respectively. The openings 324a, 324b and 324c may be, for example, elongate slots extending along the respective copper traces. The exposed copper traces 302a, 302b and 302c are potential equivalent, for example, they are all coupled to ground signal $V_{SS}$.

RDLs 326a, 326b and 326c are formed over the passivation layer 120. The opening 324a is filled with the RDL 326a, the opening 324b is filled with the RDL 326b, and the opening 324c is filled with the RDL 326c. A cavity 310a is thus defined between the RDL 326a and the RDL 326b, and a cavity 310b is also thus defined between the RDL 326b and the RDL 326c. A thick conductive member 300a and a thick conductive member 300b are inlaid into the cavity 310a and cavity 310b, respectively. For example, the conductive members 300a and 300b have a thickness greater than 5 µm, for example, ranging between 3-5 mil (75-125 µm).

By means of a conductive means 322 such as a silver epoxy, the conductive member 300a is electrically connected with the RDL 326a and the RDL 326b, and the conductive member 300b is electrically connected with the RDL 326b and the RDL 326c. The RDL 326a, the conductive member 300a, the RDL 326b, the conductive member 300b and the RDL 326c constitute a low resistance path for ground signal. Since the conductive members 300a and 300b are thick, the localized voltage drop can be reduced. Moreover, the conductive means 322 may be omitted by fitting the conductive members 300a and 300b respectively in size between the RDLs 326a, 326b and 326c.

Figure 9:
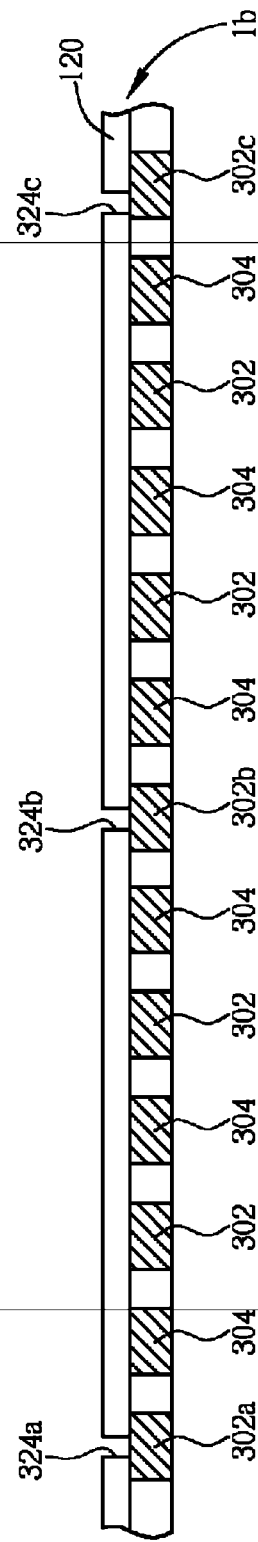
FIGS. 9-12 are schematic, cross-sectional diagrams showing the exemplary method for fabricating the integrated circuit die of FIG. 8.

According to the second embodiment of this invention, the conductive members 300a and 300b are mounted on the passivation layer 120 after the RDL process is completed. FIGS. 9-12 are schematic, cross-sectional diagrams showing the exemplary method for fabricating the integrated circuit die of FIG. 8. As shown in FIG. 9, a plurality of copper metal traces 302 and 304 for routing ground or power signals are formed in the topmost copper metal layer of the integrated circuit die 1b. For the sake of simplicity, merely the topmost copper metal layer is demonstrated.

A passivation layer 320 is deposited to cover the plurality of copper metal traces 302 and 304. The passivation layer 320 may be silicon oxide, silicon nitride, polyimide or other suitable materials. In the passivation layer 320, openings 324a, 324b and 324c corresponding to the copper traces 302a, 302b and 302c are provided. The openings 324a, 324b and 324c expose portions of the copper traces 302a, 302b and 302c, respectively. The openings 324a, 324b and 324c may be, for example, elongate slots extending along the respective copper traces 302a, 302b and 302c. The exposed copper traces 302a, 302b and 302c are of an equivalent potential, for example, they are all coupled to ground signal $V_{SS}$.

Figure 10:
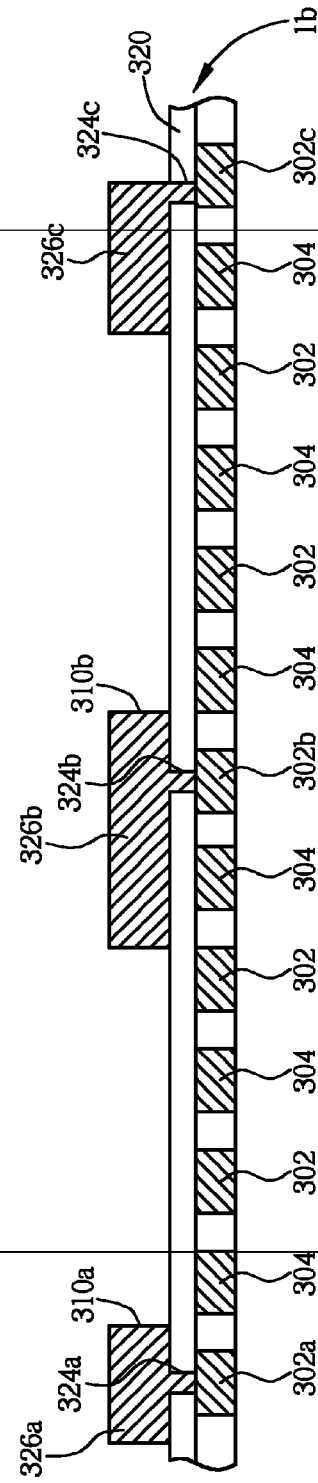

As shown in FIG. 10, An RDL 326a, an RDL 326b and an RDL 326c are formed over the passivation layer 120, for example, by lithographic and etching process. The opening 324a is filled with the RDL 326a, the opening 324b is filled with the RDL 326b, and the opening 324c is filled with the RDL 326c. A cavity 310a is defined between the RDL 326a and the RDL 326b, and a cavity 310b is defined between the RDL 326b and the RDL 326c.

Figure 11:
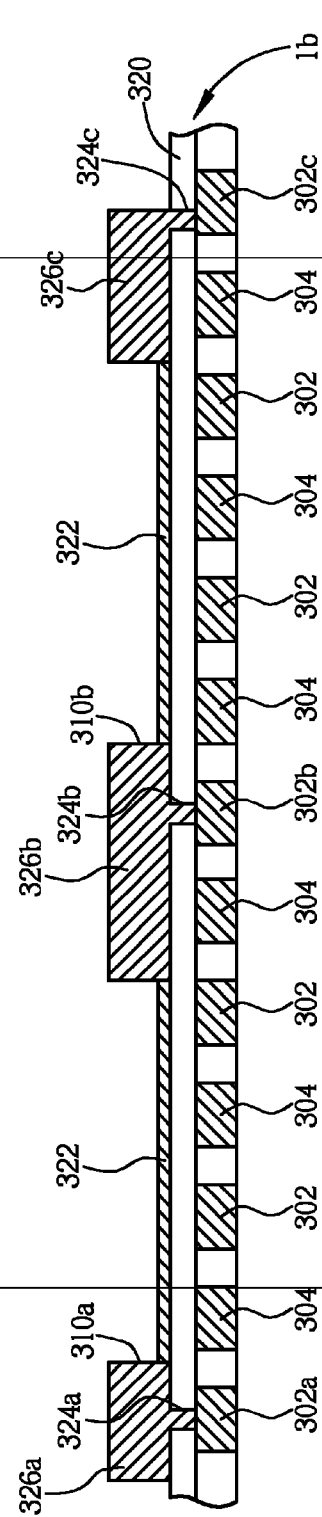

As shown in FIG. 11, a conductive means 322, such as a layer of conductive adhesive, is utilized in the cavity 310a and in the cavity 310b. The conductive means 322 may comprise silver epoxy.

Figure 12:
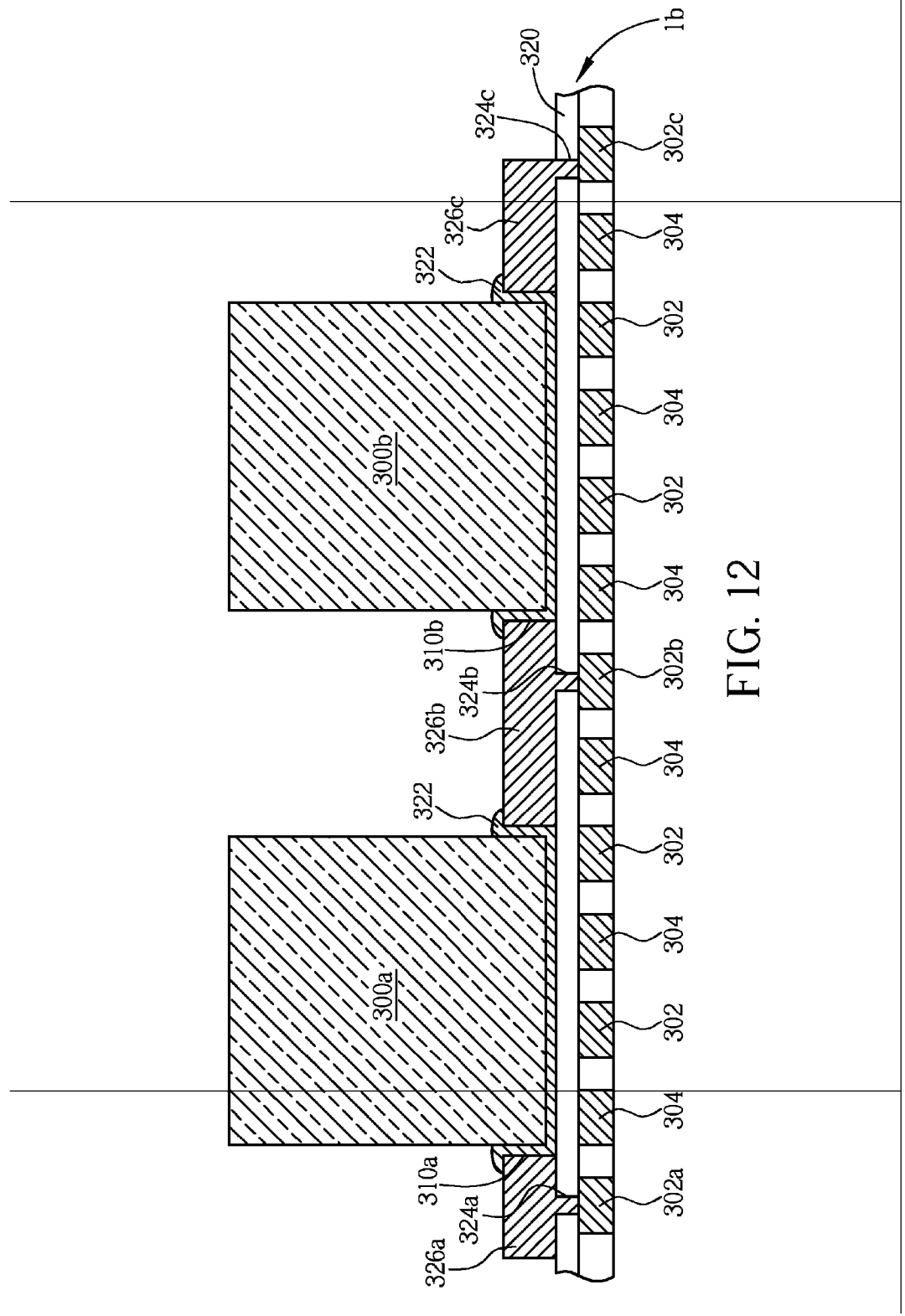

As shown in FIG. 12, a thick conductive member 300a and a thick conductive member 300b are inlaid into the cavity 310a and cavity 310b, respectively. For example, the conductive members 300a and 300b have a thickness greater than 5 μm, for example, ranging between 3-5 mil (75-125 μm). The conductive member 300a is electrically connected with the RDL 326a and the RDL 326b, and the conductive member 300b is electrically connected with the RDL 326b and the RDL 326c.

In the embodiment, the RDL 326a, the conductive member 300a, the RDL 326b, the conductive member 300b and the RDL 326c constitute a low resistance path for ground signal. Subsequently, typical packaging process may be carried out to complete the semiconductor device package, for example, the integrated circuit die 1b is then mounted onto a packaging substrate; and thereafter a heat spreader (not shown) is positioned and mounted on the packaging substrate, wherein the heat spreader can be selectively in direct contact with the conductive member 300a.

Figure 13:
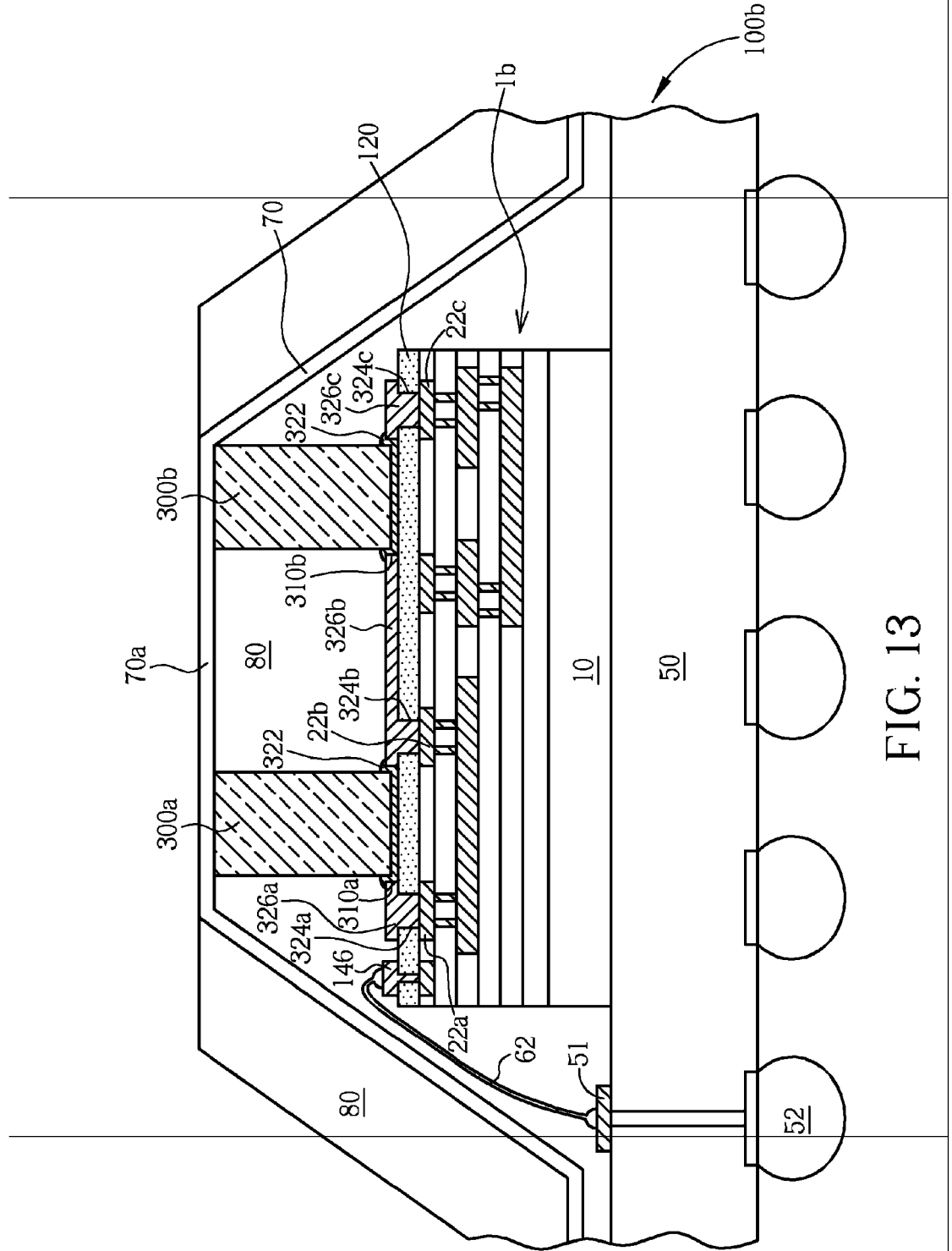
FIG. 13 is a schematic, cross-sectional diagram showing an exemplary PBGA package having a metal heat spreader according to still another embodiment of this invention.

FIG. 13 is a schematic, cross-sectional diagram showing an exemplary PBGA package having a metal heat spreader according to still another embodiment of this invention. As shown in FIG. 13, an integrated circuit die 1b is surface mounted on a first side of a packaging substrate 50. Likewise, the packaging substrate 50 has thereon at least one wire bond pad 51 such as a ground pad on its first side and is wire bonded to a corresponding peripheral I/O bond pad 146 on the integrated circuit die 1b via wire bond 62 such as a gold wire. On the second side (opposite to the first side) of the packaging substrate 50, solder balls 52 are provided. The PBGA package 100b can be attached to a product board by reflowing the solder balls 52 to establish electrical and structural connection.

The integrated circuit die 1b includes a semiconductor substrate 10. A bottom side of the semiconductor substrate 10 is surface mounted on the first side of the packaging substrate 50. Inter-metal dielectric (IMD) layers are formed on the semiconductor substrate 10. Levels of metal interconnection are formed in the respective IMD layers. For the sake of simplicity, merely an upper portion of the metal interconnection structure is demonstrated. The metal interconnection and respective via plugs may be fabricated using copper damascene processes or dual damascene processes.

In a copper metal layer of the metal interconnection structure, copper traces 22a, 22b and 22c for routing the same voltage signal such as ground signal $V_{SS}$ or power signal $V_{DD}$ are provided. That is, the copper traces 22a, 22b and 22c are of an equivalent potential of either ground signal $V_{SS}$ or power signal $V_{DD}$. A passivation layer 120 such as silicon oxide or silicon nitride covers the copper traces 22a, 22b and 22c. In the passivation layer 120, openings 324a, 324b and 324c corresponding to the copper traces 22a, 22b and 22c are provided. The openings 324a, 324b and 324c expose portions of the copper traces 22a, 22b and 22c, respectively. The openings 324a, 324b and 324c may be, for example, elongate slots extending along the respective copper traces 22a, 22b and 22c.

An RDL 326a, an RDL 326b and an RDL 326c are formed over the passivation layer 120. The opening 324a is filled with the RDL 326a, the opening 324b is filled with the RDL 326b, and the opening 324c is filled with the RDL 326c. A cavity 310a is defined between the RDL 326a and the RDL 326b, and a cavity 310b is defined between the RDL 326b and the RDL 326c. A layer of conductive adhesive 322 is utilized in the cavity 310a and in the cavity 310b. A thick conductive member 300a and a thick conductive member 300b are inlaid into the cavity 310a and cavity 310b, respectively. For example, the conductive members 300a and 300b have a thickness greater than 5 μm, for example, 75-125 μm. The conductive member 300a is electrically connected with the RDL 326a and the RDL 326b, and the conductive member 300b is electrically connected with the RDL 326b and the RDL 326c.

The PBGA package 100b further comprises a heat spreader 70 that is mounted on the first side of the packaging substrate 50. The heat spreader 70, which is generally in a shape of a truncated square pyramid with chamfered slant edges, caps the integrated circuit die 1b for dissipating heat generated from the integrated circuit die 1b. A mold cap 80 encapsulates the integrated circuit die 1b and the heat spreader 70. The heat spreader 70 may be either completely or partially embedded in the mold cap 80. In a case that the heat spreader 70 is partially embedded in the mold cap 80, a top surface of a plain portion 70a of the heat spreader 70 is exposed to the ambient and is free of molding compound. The plain portion 70a of the heat spreader 70 may be in direct contact with the thick conductive member 300a or 300b. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip, comprising:
   a packaging substrate; and
   an integrated circuit die mounted on a first side of the packaging substrate, the integrated circuit die comprising:
   a semiconductor substrate;
   a plurality of inter-metal dielectric (IMD) layers on the semiconductor substrate;
   a plurality of levels of metal interconnection in the respective IMD layers, wherein at least two potential equivalent metal traces are formed in one level of the metal interconnection;
   a passivation layer covering the at least two potential equivalent metal traces, wherein two openings are formed in the passivation layer to expose portions of the at least two potential equivalent metal traces;

a conductive member externally mounted on the passivation layer between the two openings; and a redistribution layer (RDL) formed over the conductive member, wherein the RDL fills into the two openings such that the potential equivalent metal traces are electrically connected to each other through the RDL and the conductive member.

2. The semiconductor chip of claim 1 wherein the at least two potential equivalent metal traces are coupled to ground ($V_{ss}$) signal or power ($V_{DD}$) signal.

3. The semiconductor chip of claim 1 wherein the conductive member is a dummy die.

4. The semiconductor chip of claim 1 wherein the conductive member is a piece of metal, wherein the piece of metal is copper, gold, silver or their combinations.

5. The semiconductor chip of claim 1 wherein the conductive member has a thickness ranging greater than 5 μm.

6. The semiconductor chip of claim 1 further comprising a heat spreader mounted on the first side of the packaging substrate and covering the integrated circuit die therein, wherein the heat spreader is in direct contact with the RDL.

7. The semiconductor chip of claim 1 wherein a spacer layer is interposed between the conductive member and the passivation layer.

8. The semiconductor chip of claim 7 wherein the spacer layer is made of adhesive material.

9. The semiconductor chip of claim 1 wherein the at least two potential equivalent metal traces are formed in a topmost level of the metal interconnection, and wherein the conductive member overlies the topmost level of the metal interconnection.

10. A semiconductor chip, comprising:
a packaging substrate; and
an integrated circuit die mounted on a first side of the packaging substrate, the integrated circuit die comprising:
at least two potential equivalent metal traces formed in a level of metal interconnection;
a passivation layer covering the at least two potential equivalent metal traces, wherein two openings are formed in the passivation layer to expose portions of the at least two potential equivalent metal traces;
a redistribution layer (RDL) formed on the passivation layer, wherein the RDL fills into the two openings and comprises two blocks which define a cavity over the passivation layer; and
an electrically conductive member set into the cavity.

11. The semiconductor chip of claim 10 wherein the at least two potential equivalent metal traces are coupled to ground ($V_{ss}$) signal or power ($V_{DD}$) signal.

12. The semiconductor chip of claim 10 wherein the electrically conductive member has a thickness greater than 5 μm.

13. The semiconductor chip of claim 10 further comprising a heat spreader mounted on the first side of the packaging substrate and covering the integrated circuit die therein, wherein the heat spreader is in direct contact with the electrically conductive member.

14. The semiconductor chip of claim 10 further comprising conductive means interposed between the electrically conductive member and the RDL.

15. The semiconductor chip of claim 14 wherein the conductive means comprises silver epoxy.

16. A semiconductor chip, comprising:
a packaging substrate; and
an integrated circuit die mounted on a first side of the packaging substrate, the integrated circuit die comprising:
at least two potential equivalent metal traces formed in a level of metal interconnection;
a passivation layer covering the at least two potential equivalent metal traces, wherein two openings are formed in the passivation layer to expose portions of the at least two potential equivalent metal traces;
a redistribution layer (RDL) formed on the passivation layer, wherein the RDL fills into the two openings and comprises two blocks which define a cavity over the passivation layer; and
a conductive member set into the cavity, wherein the conductive member is a piece of metal, wherein the piece of metal is copper, gold, silver or their combinations.

17. A semiconductor chip, comprising:
a packaging substrate; and
an integrated circuit die mounted on a first side of the packaging substrate, the integrated circuit die comprising:
at least two potential equivalent metal traces formed in a level of metal interconnection;
a passivation layer covering the at least two potential equivalent metal traces, wherein two openings are formed in the passivation layer to expose portions of the at least two potential equivalent metal traces;
a redistribution layer (RDL) formed on the passivation layer, wherein the RDL fills into the two openings and defines a cavity over the passivation layer, wherein the cavity is located between the two openings; and
an electrically conductive member set into the cavity.

* * * * *